United States Patent
Lin et al.

(10) Patent No.: US 9,882,023 B2
(45) Date of Patent: Jan. 30, 2018

(54) SIDEWALL SPACERS FOR SELF-ALIGNED CONTACTS

(71) Applicant: Taiwan Semiconductor Manufacturing Co., Ltd., Hsinchu (TW)

(72) Inventors: Jyun-Ming Lin, Hsinchu (TW); Hua Feng Chen, Hsinchu (TW); Kuo-Hua Pan, Hsinchu (TW); Min-Yann Hsieh, Hsinchu (TW); C. H. Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/056,454

(22) Filed: Feb. 29, 2016

(65) Prior Publication Data

US 2017/0250264 A1 Aug. 31, 2017

(51) Int. Cl.
| | |
|---|---|
| *H01L 21/28* | (2006.01) |
| *H01L 21/8234* | (2006.01) |
| *H01L 29/66* | (2006.01) |
| *H01L 21/311* | (2006.01) |
| *H01L 29/78* | (2006.01) |
| *H01L 29/423* | (2006.01) |
| *H01L 29/51* | (2006.01) |
| *H01L 23/535* | (2006.01) |

(52) U.S. Cl.
CPC .. *H01L 29/66553* (2013.01); *H01L 21/28008* (2013.01); *H01L 21/31111* (2013.01); *H01L 21/823431* (2013.01); *H01L 21/823468* (2013.01); *H01L 23/535* (2013.01); *H01L 29/4238* (2013.01); *H01L 29/512* (2013.01); *H01L 29/78* (2013.01)

(58) Field of Classification Search
CPC ... H01L 29/78; H01L 29/4238; H01L 29/512; H01L 29/42312; H01L 29/6656; H01L 29/66719; H01L 23/535; H01L 21/28008; H01L 21/31111; H01L 21/28; H01L 21/28132; H01L 21/823466; H01L 21/82345; H01L 21/823431; H01L 21/823821; H01L 21/845
See application file for complete search history.

(56) References Cited

U.S. PATENT DOCUMENTS 7,459,382 B2 * 12/2008 Amos ............... H01L 21/28097
257/E21.203
2004/0070033 A1 * 4/2004 Shin .................... H01L 27/0629
257/379

(Continued)

*Primary Examiner* — Galina Yushina
(74) *Attorney, Agent, or Firm* — Sterne, Kessler, Goldstein & Fox P.L.L.C.

(57) ABSTRACT

A semiconductor device and method for fabricating such a device are presented. The semiconductor device includes a first gate electrode of a transistor, a first sidewall spacer along a sidewall of the gate pattern, a first insulating layer in contact with the first sidewall spacer and having a planarized top surface, and a second sidewall spacer formed on the planarized top surface of the first insulating layer. The second sidewall spacer may be formed over the first sidewall spacer. A width of the second sidewall spacer is equal to or greater than a width of the first sidewall spacer.

20 Claims, 12 Drawing Sheets

(56) References Cited

U.S. PATENT DOCUMENTS

| | | | |
|---|---|---|---|
| 2008/0017933 A1* | 1/2008 | Kao | H01L 27/0629 257/379 |
| 2014/0306351 A1* | 10/2014 | Kim | H01L 21/76855 257/774 |
| 2015/0048439 A1* | 2/2015 | Shum | H01L 29/7816 257/326 |
| 2015/0380406 A1* | 12/2015 | Chang | H01L 27/0922 257/369 |
| 2017/0098711 A1* | 4/2017 | Hsiao | H01L 29/7856 |

* cited by examiner

SIDEWALL SPACERS FOR SELF-ALIGNED CONTACTS

BACKGROUND

Many developments in both semiconductor structures and manufacturing processes have contributed to reducing the size and increasing the performance of integrated circuits. As gate lengths continue to shrink, it becomes increasingly difficult to reduce parasitic effects and avoid shorting between adjacent components. Specifically, as the distance between a transistor gate and its associated source/drain contact becomes smaller due to shrinking of the unit cell size, a short between the gate and contact may occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
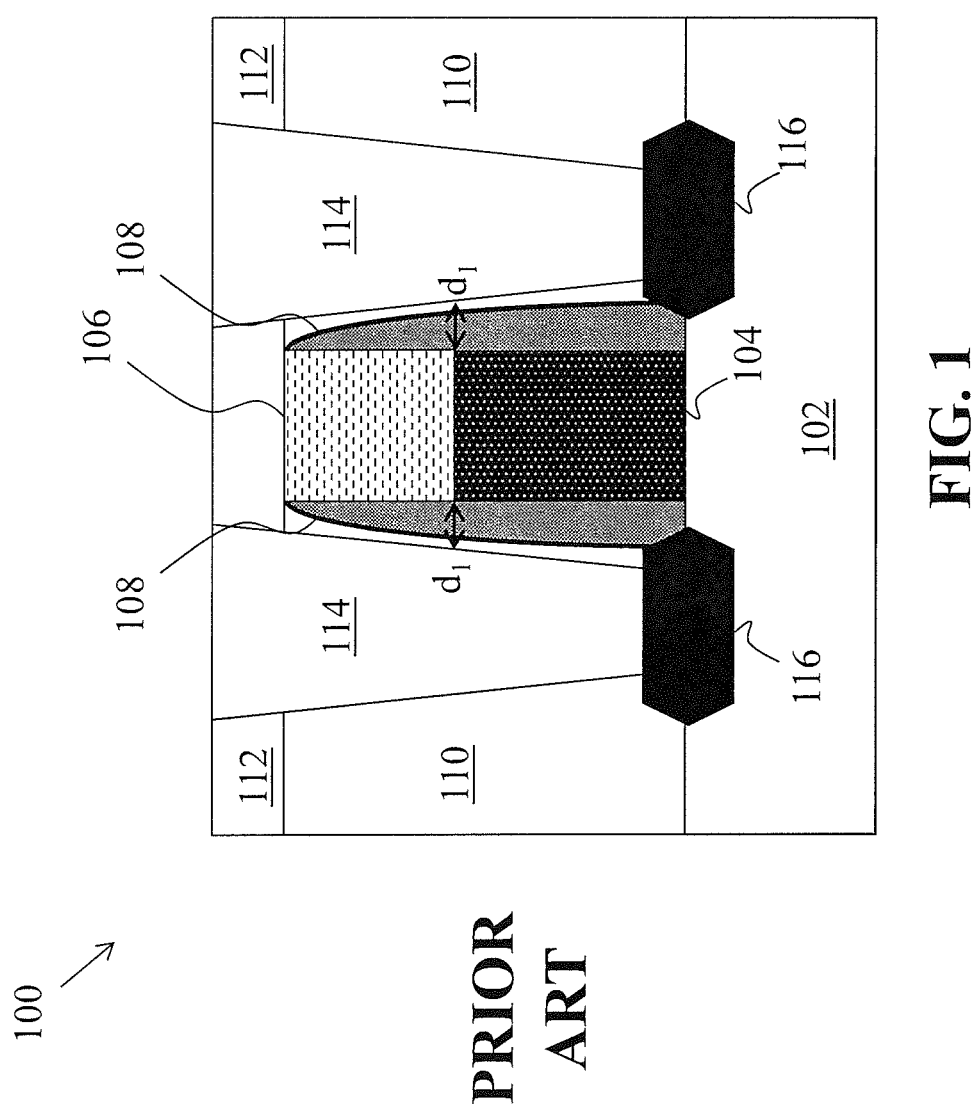
FIG. 1 is a cross-sectional view of an example semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A very common type of FET is the metal oxide semiconductor field effect transistor (MOSFET). Historically, MOSFETs have been planar structures built in and on the planar surface of a substrate such as a semiconductor wafer. But recent advances in semiconductor manufacturing have resulted in the use vertical structures.

The term "finFET" refers to a FET that is formed over a fin that is vertically oriented with respect to the planar surface of a wafer.

The term "S/D" refers to the source/drain junctions that form two of the four terminals of a FET.

The expression "epitaxial layer" herein refers to a layer or structure of single crystal material. Likewise, the expression "epitaxially grown" herein refers to a layer or structure of single crystal material.

The expression "high-k" refers to a high dielectric constant. In the field of semiconductor device structures and manufacturing processes, high-k refers to a dielectric constant that is greater than the dielectric constant of $SiO_2$ (i.e., greater than 3.9).

The expression "low-k" refers to a low dielectric constant. In the field of semiconductor device structures and manufacturing processes, low-k refers to a dielectric constant that is less than the dielectric constant of $SiO_2$ (i.e., less than 3.9).

The term "contact" refers to a structure for electrical connection of conductors from different interconnect levels. These terms are sometimes used in the art to describe both an opening in an insulator in which the structure will be completed, and the completed structure itself. For purposes of this disclosure "contact" refers to the completed structure, and "contact hole" refers to the opening in one or more insulating layers in which the structure, i.e., the contact, is formed.

The term "nominal" as used herein refers to a desired, or target, value of a characteristic or parameter for a component or a signal, set during the design phase of a product, together with a range of values above and/or below the desired value. The range of values is typically due to slight variations in manufacturing processes or tolerances. By way of example and not limitation, a resistor may be specified as having a nominal value of 10 KΩ, which would be understood to mean 10 KΩ plus or minus a certain percentage (e.g., ±5%) of the specified value.

The term "vertical," as used herein, means nominally perpendicular to the surface of a substrate.

Overview

Various embodiments in accordance with this disclosure provide FETs with a wider distance between a gate electrode and a contact to an S/D region of the FET. This wider distance is facilitated by the presence of a second set of sidewall spacers formed above the sidewall spacers on the gate electrode, according to an embodiment. By increasing the distance between the gate electrode and the S/D contact of a FET, the risk of an electrical short or damaging parasitic effects may be reduced.

FIG. 1 is a cross-sectional view of a semiconductor device 100 that includes a gate electrode 104 patterned over a substrate 102. It should be noted that gate electrode 104 would be disposed on a dielectric material that is disposed between gate electrode 104 and substrate 102 (e.g., silicon dioxide), but such a layer is not shown here to reduce the complexity of the illustration. Semiconductor device 100 further includes a hard mask 106 patterned on top of gate electrode 104, and sidewall spacers 108 along the sidewalls of gate electrode 104 and hard mask 106.

Sidewall spacers 108 may be used to separate gate electrode 104 from raised S/D regions 116. Raised S/D regions 116 may be epitaxially grown. Field oxide regions (not shown) may be present within substrate 102 at the left and right ends of semiconductor device 100 in order to electrically isolate semiconductor device 100 from any neighboring devices. Sidewall spacers 108 may be used in a conventional method for protecting gate electrode 104 during the contact hole etch that occurs through one or more insulating layers 110 and 112. After etching, the contact holes are filled with contact material 114 to create a conductive path down to raised S/D regions 116.

As identified by the double-ended arrows labeled $d_1$ in FIG. 1, the distance between gate electrode 104 and contact material 114 may be as little as about 3 nm. Such a short distance causes problems when the contact hole etch is misaligned and contact material 114 ends up in contact with, or only a few nanometers from, sidewall spacers 108. Parasitic effects may cause cross-talk, or in extreme cases, a short, between metal gate 104 and contact material 114. In order to continue reducing the size of semiconductor devices, the decrease in spacing between gate electrodes and contacts must be addressed.

Figure 2A:
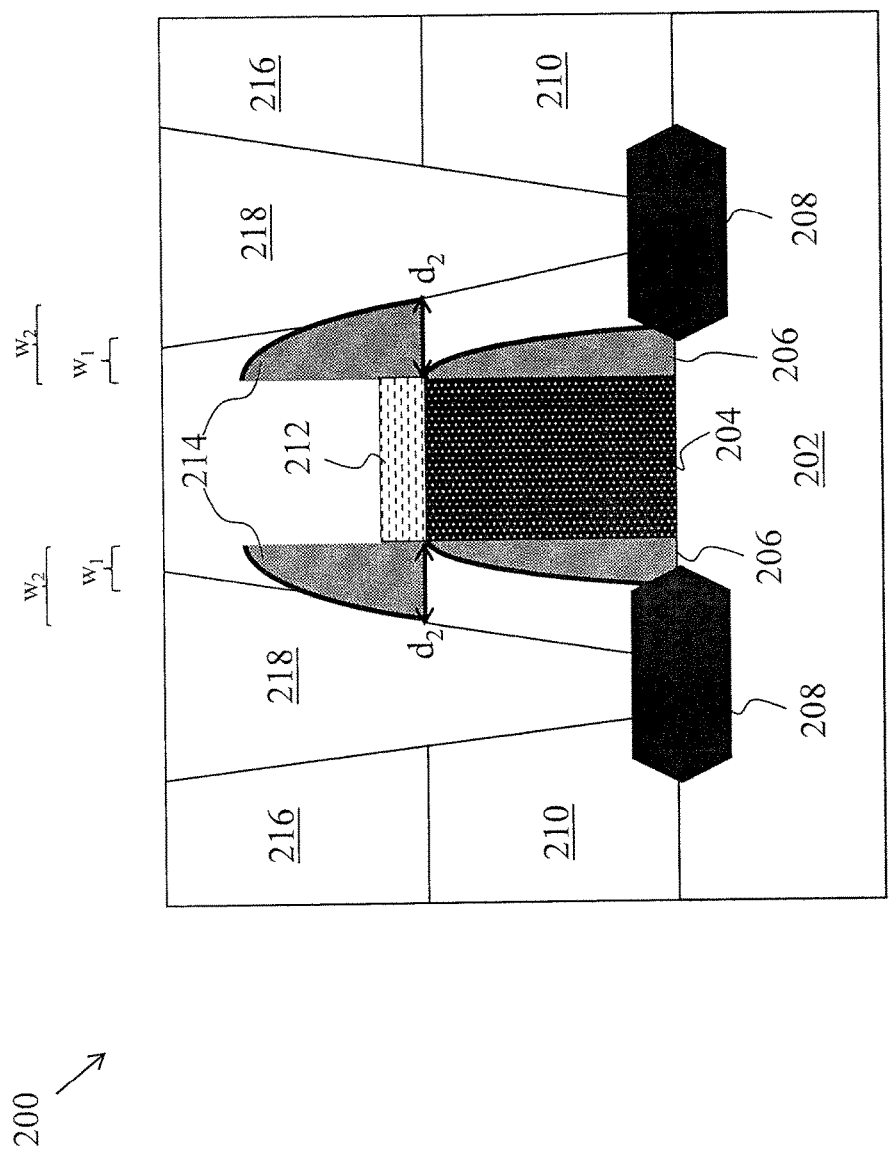
FIG. 2A is a cross-sectional view an example semiconductor device that includes expanded sidewall spacers, according to an embodiment.

FIG. 2A is a cross-sectional view of a semiconductor device 200 that solves the spacing problems noted above, according to an embodiment. Semiconductor device 200 may represent a planar MOSFET or finFET. Semiconductor device 200 includes a gate electrode 204 patterned over a substrate 202. As noted in connection with FIG. 1, gate electrode 204 would have a dielectric material between gate electrode 204 and substrate 202 (e.g., silicon dioxide), but such a layer is not shown here to reduce the complexity of the illustration.

Substrate 202 may be a silicon substrate. Alternatively, substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, substrate 202 is a semiconductor on insulator (SOI). Gate electrode 204 may represent one or more patterned conductive layers that act as a gate electrode for semiconductor device 200. For example, gate electrode 204 may be polysilicon, or may include TiN, TaN, Ru, Mo, Al, WN, $ZrSi_2$, $MoSi_2$, $TaSi_2$, $NiSi_2$, WN, Ti, Ag, TaAl, TaAlC, TiAlN, TaC, TaCN, TaSiN, Mn, Zr, or combinations thereof.

A first set of sidewall spacers 206 are formed on sidewalls of gate electrode 204 according to an embodiment. Sidewall spacers 206 may be any electrically insulating material. For example, sidewall spacers 206 are formed from silicon dioxide, silicon nitride, high-k dielectric materials, or low-k dielectric materials. Sidewall spacers 206 have a full width identified as $w_1$ in FIG. 2. In an embodiment, the width $w_1$ of sidewall spacers 206 is between about 3 nm and about 20 nm.

Semiconductor device 200 also includes raised S/D regions 208. Raised S/D regions 208 may include epitaxially grown material. In the case of an n-channel FET, the epitaxially grown material may include silicon carbide (SiC), phosphorus-doped silicon (SiP), or phosphorus-doped silicon carbide (SiCP.) In the case of a p-channel FET, the epitaxially grown material may include silicon germanium (SiGe) or boron-doped silicon germanium (SiGeB). Alternatively, S/D regions may include areas of substrate 202 that have been highly doped with n-type or p-type dopants. Example n-type dopants include phosphorous or arsenic while example p-dopants include boron.

A first insulating layer 210 is deposited and planarized thereby exposing gate electrode 204, according to an embodiment. First insulating layer 210 may be any number of electrically insulating materials such as silicon dioxide, silicon nitride, high-k or low-k dielectric materials. Patterned on the planarized surface of first insulating layer 210 is a second gate electrode 212 and a second set of sidewall spacers 214, according to an embodiment. Sidewall spacers 214 may be formed on sidewalls of second gate electrode 212 before an etch is performed to reduce a thickness of second gate electrode 212. A final thickness of second gate 212 may be between about 0 nm and 10 nm. Insulating spacers 214 may include a material similar to sidewall spacers 206 while second gate electrode 212 may include a material similar to gate electrode 204. In one example, second gate electrode 212 includes tungsten.

Sidewall spacers 214 have a full width identified as $w_2$ in FIG. 2A. In an embodiment, the width $w_2$ of sidewall spacers 214 is between about 5 nm and 20 nm. In an embodiment, a height of sidewall spacers 214 is between about 5 nm and 20 nm. Sidewall spacers 214 have a width that is equal to or greater than a width of sidewall spacers 206, according to an embodiment.

Contacts 218 fill the contact holes that are formed by etching through a second insulating layer 216 and through first insulating layer 210 to expose raised S/D regions 208. As such, contacts 218 make electrical contact with raised S/D regions 208. Second insulating layer 216 may be the same as the material of the first insulating layer 210. According to an embodiment, the material chosen for sidewall spacers 214 is different from the material chosen for first insulating layer 210 and second insulating layer 216, such that an etch rate through first and second insulating layers 210 and 216 is substantially greater than an etch rate through sidewall spacers 214.

As can be seen in FIG. 2A, the contact hole etch does not etch (or etches at a substantially slower rate) sidewall spacers 214 such that contacts 218 are spaced at a distance $d_2$ away from gate electrode 204, even when the etch is misaligned. Distance $d_2$ is larger than distance $d_1$ from the conventional process illustrated in FIG. 1, according to an embodiment.

Figure 2B:
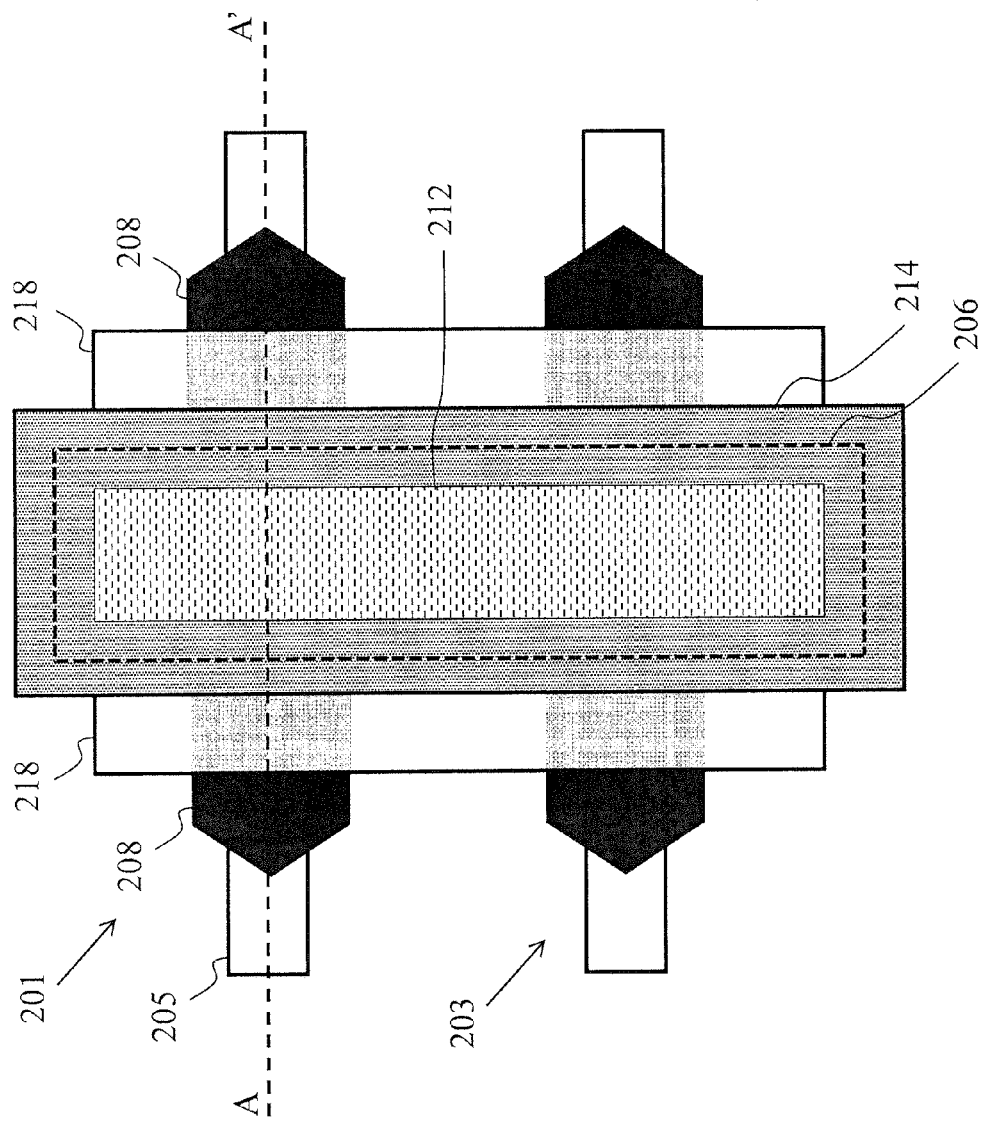
FIG. 2B is a top-down view of an example finFET device that includes expanded sidewall spacers, according to an embodiment.

FIG. 2B illustrates a top-down view of a semiconductor device having a first finFET 201 and a second finFET 203. In an embodiment, FIG. 2A is a cross section taken along the length of the fin (line A-A') as illustrated in FIG. 2B. As such, finFET 201 includes many of the same structures identified in FIG. 2A, including sidewall spacers 206, S/D regions 208, second gate electrode 212 (which covers gate electrode 204), sidewall spacers 214, and contacts 218. These various elements are patterned over fin region 205, which extends above substrate 202.

FIGS. 3A-3F provide an example process flow to fabricate a semiconductor device 300. Once the fabrication process is complete, semiconductor device 300 may be the same as semiconductor device 200. Some steps have been omitted for clarity, and it should be understood that other material layers or patterned features may be present as part of semiconductor device 300, but are not shown for clarity. The various features illustrated in the process flow may not be drawn to scale. Semiconductor device 300 may represent a planar FET or FinFET.

Figure 3A:
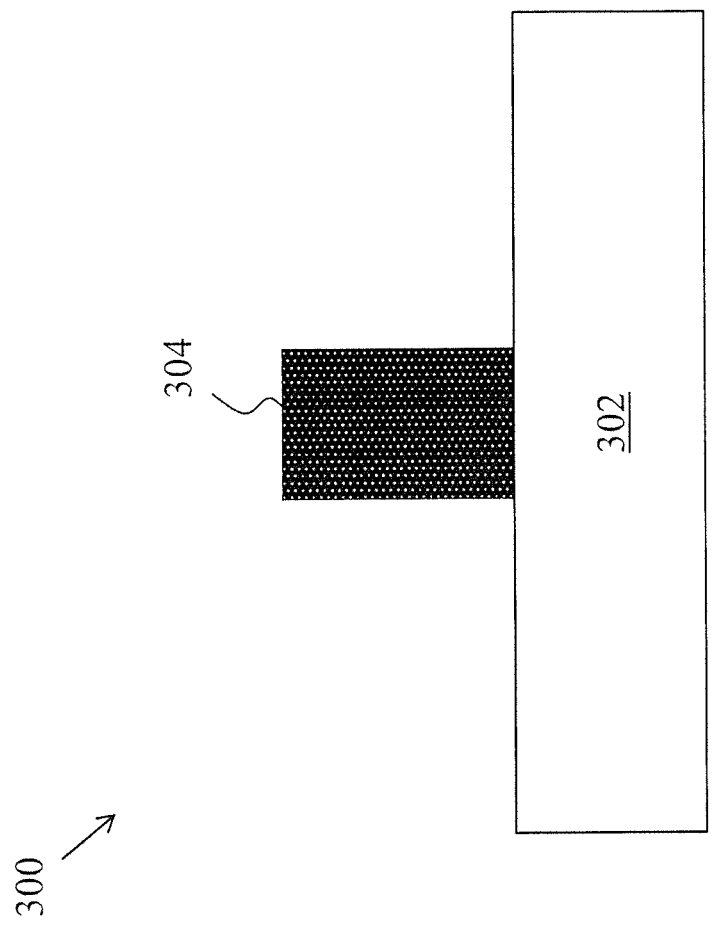
FIGS. 3A-3F are cross-sectional views of an example process flow for fabricating the semiconductor device that includes expanded sidewall spacers, according to an embodiment.

FIG. 3A shows a conductive layer after it has been patterned to form a first gate pattern 304 over substrate 302, according to an embodiment. As noted earlier, a dielectric layer between first gate pattern 304 and substrate 302 is present, but not shown in the figure. First gate pattern 304 may be formed using any known etching technique, such as wet etching, dry etching, or lift-off. First gate pattern 304 may represent a single conductive material, or a layered stack of different conductive materials.

Figure 3B:
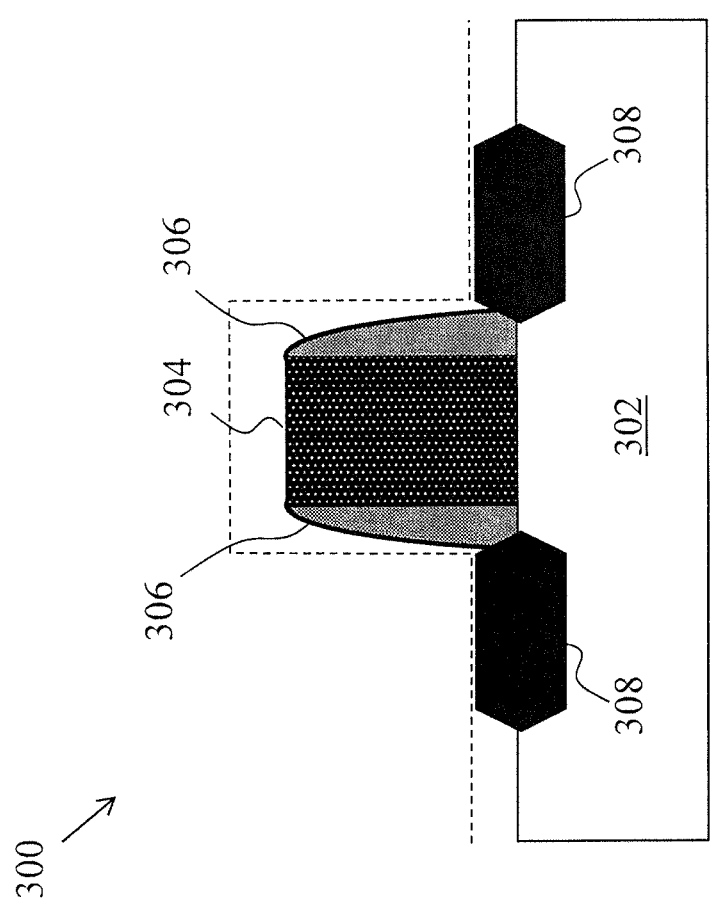

FIG. 3B shows the first sidewall spacers 306, formed adjacent to the sidewalls of first gate pattern and raised S/D regions 308, according to an embodiment. The dotted line illustrates the deposition of a material layer that is etched back to form sidewall spacers 306 on sidewalls of first gate pattern 304. In this exemplary embodiment, the deposition and etching take place before the formation of raised S/D regions 308. Insulating spacers 306 may be any suitable dielectric material. For example, sidewall spacers 306 may be silicon dioxide, silicon nitride, a high-k dielectric, or a low-k dielectric.

After sidewall spacers 306 have been formed, raised S/D regions 308 may be formed using any of a variety of well-known techniques. Raised S/D regions 308 may include epitaxially grown material. In the case of an n-channel FET, the epitaxially grown material may include silicon carbide (SiC), phosphorus-doped silicon (SiP), or phosphorus-doped silicon carbide (SiCP.) In the case of a p-channel FET, the epitaxially grown material may include silicon germanium (SiGe) or boron-doped silicon germanium (SiGeB). Raised S/D regions 308 may also be portions of the substrate that have been more heavily doped with n-dopants or p-dopants by, for example, plasma doping, or ion implantation. Raised S/D regions 308 are formed adjacent to first sidewall spacers 306, according to an embodiment. Raised S/D regions 308 may be used as a source and drain for semiconductor device 300.

Figure 3C:
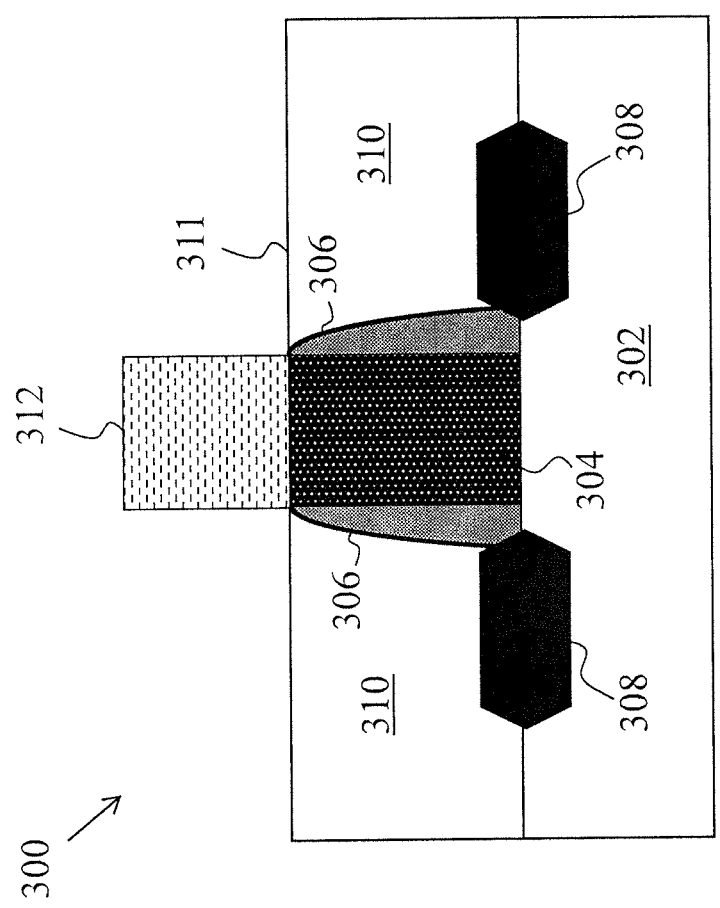

FIG. 3C shows a first insulating layer 310 after its deposition and planarization; and further shows a second conductive layer formed to implement a second gate pattern 312, according to an embodiment. First insulating layer may be deposited to cover first gate pattern 304 and first sidewall spacers 306, then polished back until a top surface of first gate pattern 304 is exposed. The polishing of first insulating layer 310 forms a planarized surface 311, upon which further structures may be formed, according to an embodiment. The polishing process may be performed using chemical mechanical polishing (CMP), to name one example technique. First insulating layer 310 may be any number of electrically insulating materials such as silicon dioxide, silicon nitride, or low-k dielectric materials.

A second conductive layer is deposited over planarized surface 311 and patterned to form second gate pattern 312 over first gate pattern 304, according to an embodiment. Second gate pattern 312 may be in electrical contact with first gate pattern 304. An initial thickness of second gate pattern 312 may be between 5 nm and 20 nm. Second gate pattern 312 may be tungsten, tantalum nitride or titanium nitride, to name a few examples.

Figure 3D:
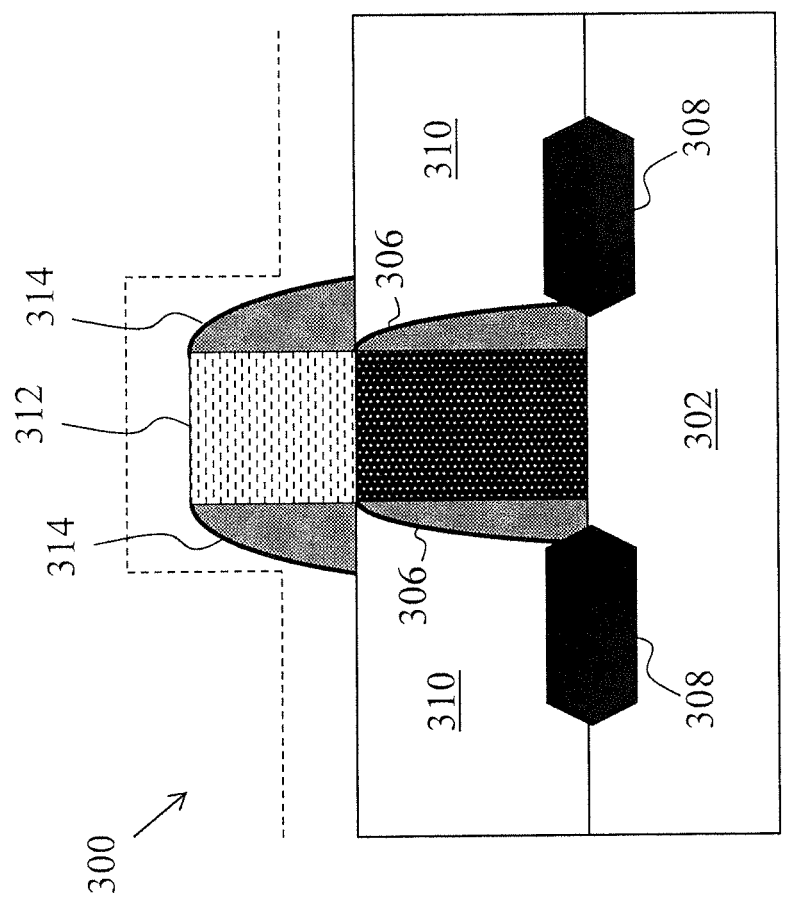

FIG. 3D shows the formation of second sidewall spacers 314 on sidewalls of second gate pattern 312, according to an embodiment. The dotted line illustrates the deposition of a material layer that is etched back to form sidewall spacers 314 on sidewalls of second gate pattern 312. Insulating spacers 314 may be any known dielectric material. For example, sidewall spacers 314 may be silicon dioxide, silicon nitride, a high-k dielectric, or a low-k dielectric. In one embodiment, sidewall spacers 314 and sidewall spacers 306 are the same material.

Insulating spacers 314 may be located over sidewall spacers 306 as shown in FIG. 3D. According to an embodiment, a width of sidewall spacers 314 is equal to or greater than a width of sidewall spacers 306. Sidewall spacers 314 may be anywhere from 10% to 100% wider than sidewall spacers 306, or anywhere from 50% to 75% wider than sidewall spacers 306. Each of the width and height of sidewall spacers 314 may be between about 5 nm and 20 nm.

Figure 3E:
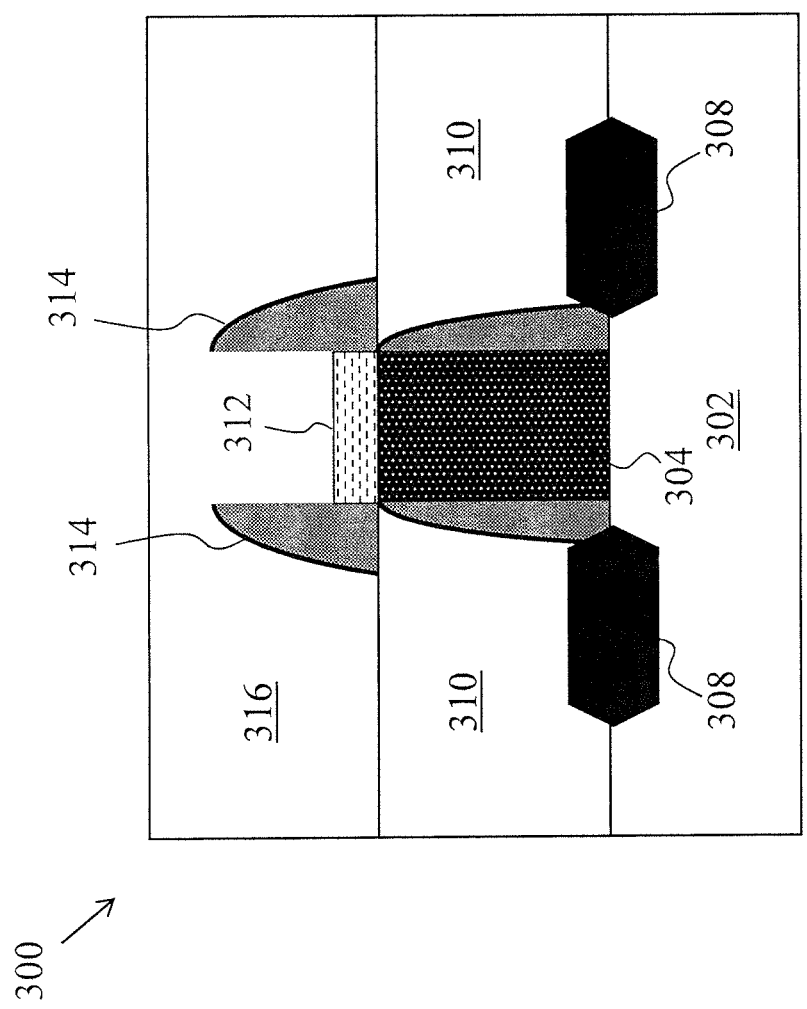

FIG. 3E shows a second insulating layer 316 after its deposition and planarization, according to an embodiment. Second insulating layer 316 may be deposited over second gate pattern 312 and sidewall spacers 314, then polished similar to first insulating layer 310. Second insulating layer 316 may be any number of electrically insulating materials such as silicon dioxide, silicon nitride, or low-k dielectric materials. In one example, first insulating layer 310 and second insulating layer 316 are the same material. In one example, first sidewall spacers 306 and second sidewall spacers 314 are a different material than both of first insulating layer 310 and second insulating layer 316, in order to provide etch selectivity between the insulating layers and the sidewall spacers. According to an embodiment, a thickness of second insulating layer 316 is greater than or equal to a height of sidewall spacers 314 after second insulating layer 316 has been polished.

Second gate pattern 312 may be etched to a final thickness between 0 nm and 10 nm, according to an embodiment. The final thickness of second gate pattern 312 may be chosen to tune the resistance of the conductive gate stack made up of first gate pattern 304 and second gate pattern 312, according to an embodiment. The overall resistance of the gate stack made up of first gate pattern 304 and second gate pattern 312 will depend on the resistivity of each material for first gate pattern 304 and second gate pattern 312 as well as the thickness of each of first gate pattern 304 and second gate pattern 312.

Figure 3F:
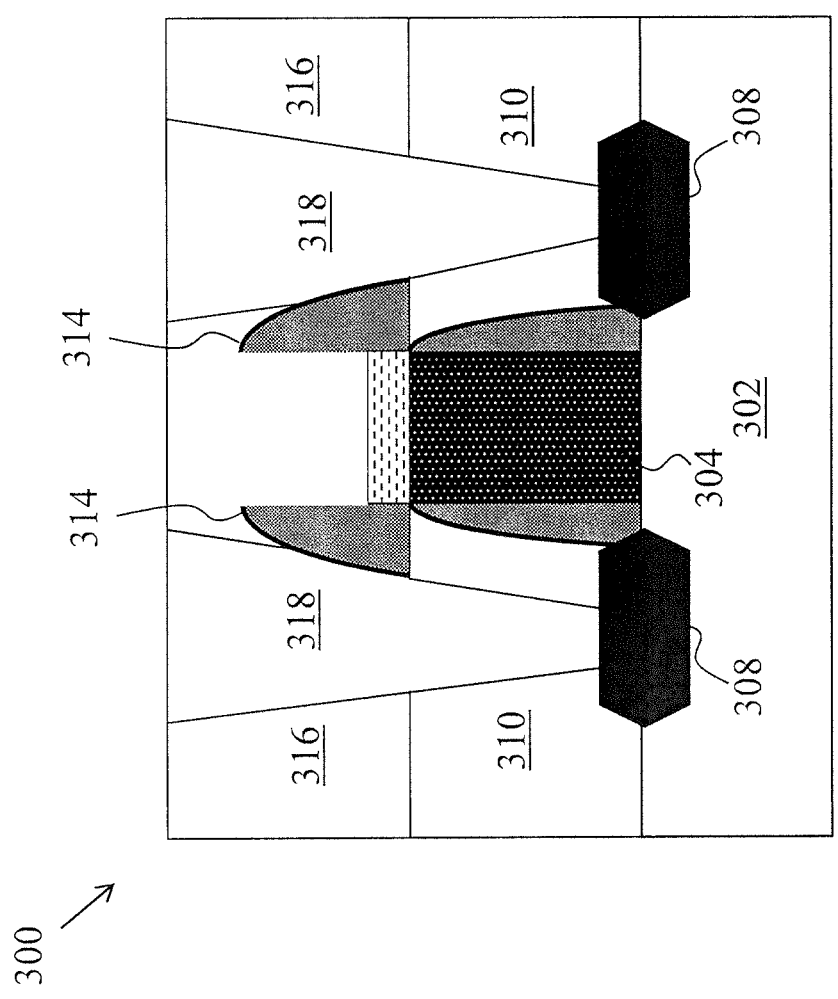

FIG. 3F shows the steps of contact hole etching and filling the contact holes with contact material 318, according to an embodiment. The contact hole etch proceeds through second insulating layer 316 and first insulating layer 310 to expose raised S/D regions 308. In an embodiment, the contact hole etch has an etch rate through first insulating layer 310 and second insulating layer 316 that is substantially faster than an etch rate through sidewall spacers 314. In this way, even if the patterned photoresist that defines the contact hole is misaligned (such that sidewall spacers 314 are exposed during the etch), sidewall spacers 314 will not be appreciably etched. In one embodiment, the contact hole etch does expose at least a portion of sidewall spacers 314.

Contact material 318 fills the contact hole formed by the contact hole etch process. Contact material 318 is used to make electrical contact with raised S/D regions 308. Due to the presence of wider sidewall spacers 314, contact material 318 is kept a greater distance away from first gate pattern 304 as compared to conventional devices.

Figure 4A:
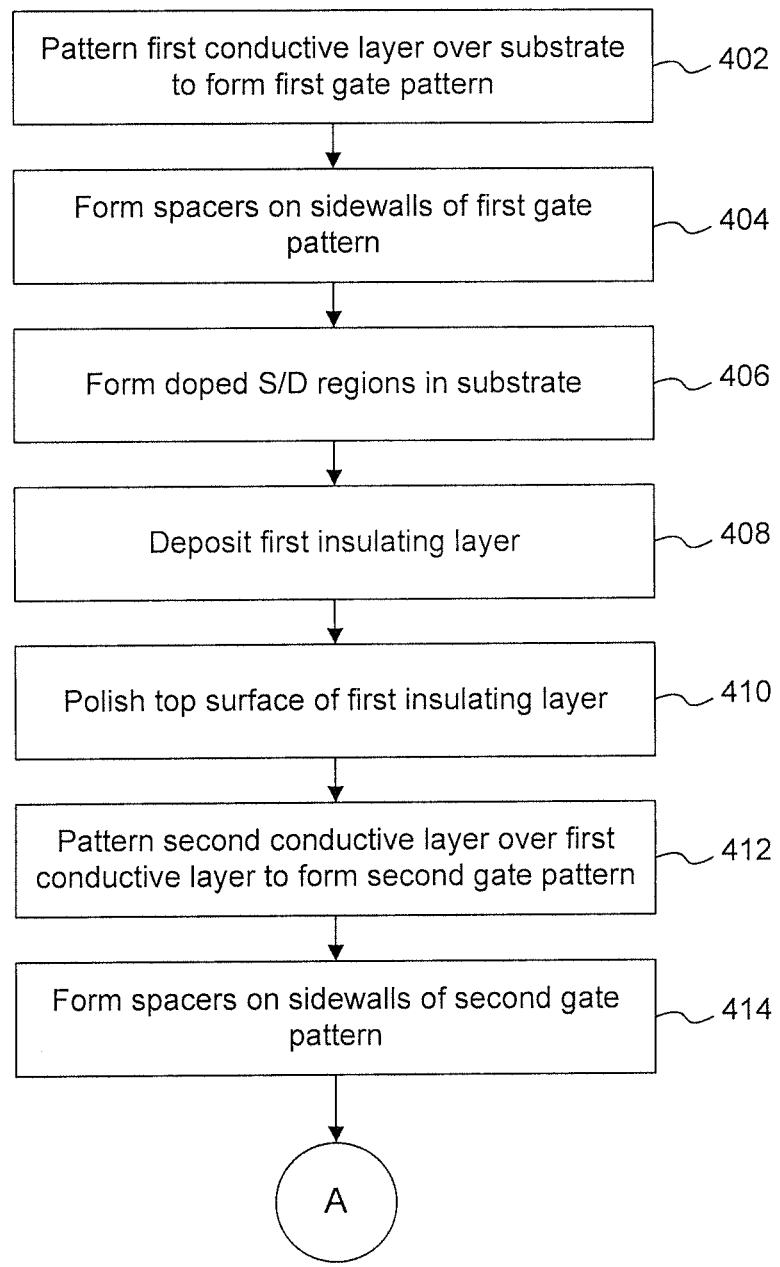
FIGS. 4A and 4B are flow diagrams of an example method, according to an embodiment.
Figure 4B:
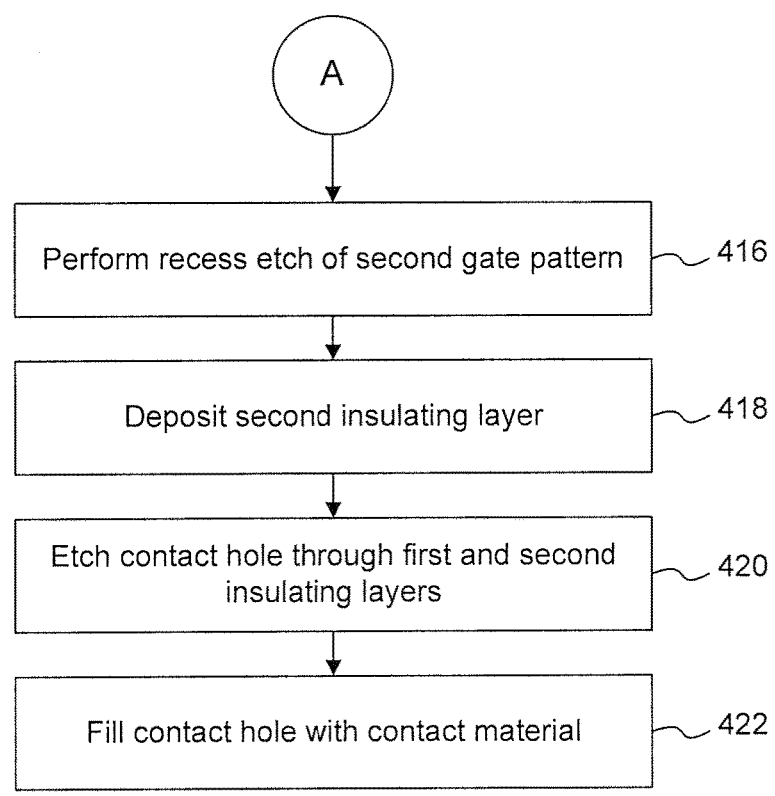

FIGS. 4A-4B provide a flow diagram of an illustrative method 400, in accordance with an embodiment, of forming a semiconductor device, such as semiconductor device 200 or 300. It is understood that additional operations may be provided before, during, and after method 400, and some of the operations described below can be replaced or eliminated for additional embodiments of the method.

Method 400 begins at operation 402 where a first conductive layer is patterned over a substrate to form a first gate pattern. A gate dielectric layer (or stack of layers) is included between the first gate pattern and the substrate. The first gate pattern may be a single material, or include a stack of conductive material layers.

Method 400 continues with operation 404 where a set of first sidewall spacers are formed on sidewalls of the first gate pattern. The first sidewall spacers may be formed using an etch-back process where a layer of material is blanket deposited and etched until the material only remains on the sidewalls of structures. The first sidewall spacers may be any number of electrically insulating materials such as, but not limited to, silicon dioxide, and silicon nitride.

Method 400 continues with operation 406 where doped S/D regions are formed on or in the substrate. The S/D regions may include epitaxially grown material. In the case of an re-channel FET, the epitaxially grown material may include silicon carbide (SiC), phosphorus-doped silicon (SiP), or phosphorus-doped silicon carbide (SiCP.) In the case of a p-channel FET, the epitaxially grown material may include silicon germanium (SiGe) or boron-doped silicon germanium (SiGeB). The S/D regions may also be portions of the substrate that have been more heavily doped with n-dopants or p-dopants by, for example, plasma doping, or ion implantation. The S/D regions may be formed adjacent to the first sidewall spacers.

Method 400 continues with operation 408 where a first insulating layer is deposited. The first insulating layer covers the first gate pattern and the first sidewall spacers, according to an embodiment. The first insulating layer may be any number of electrically insulating materials such as, but not limited to, silicon dioxide, and silicon nitride. In one embodiment, the first insulating layer is a different material than the first sidewall spacers.

Method 400 continues with operation 410 where the top surface of the first insulating layer is polished to form a planarized surface, according to an embodiment. First insulating layer may be polished until a top surface of the first gate pattern is exposed. In one embodiment, the planarized surface only needs to be smooth enough to continue fabricating structures on the planarized surface without hindrance due to the roughness of the surface.

Method 400 continues with operation 412 where a second conductive layer is deposited on the planarized surface and patterned to form a second gate pattern. The second gate pattern is patterned to lie overtop of the first gate pattern. The second gate pattern may be in electrically conductive contact with the first gate pattern. In an embodiment, the second gate pattern is formed over the first gate pattern without the need for patterning a layer of material.

Method 400 continues with operation 414 where a set of second sidewall spacers are formed on sidewalls of the second gate pattern. The second sidewall spacers may be formed using an etch-back process where a layer of material is blanket etched until the material only remains on the sidewalls of structures. The second sidewall spacers may be any number of electrically insulating materials such as silicon dioxide, silicon nitride, high-k dielectric or low-k dielectric materials. A width of the second sidewall spacers is equal to or greater than a width of the first sidewall spacers, according to an embodiment.

Method 400 continues on from FIG. 4A to FIG. 4B with operation 416 where an etch is performed to reduce a thickness of the second gate pattern. The second gate pattern may be etched to a final thickness between 0 nm and 10 nm. The thickness of the second gate pattern may be chosen to tune a resistance of the gate stack that includes the first and second gate patterns. In some embodiments, this step of etching the second gate pattern is not performed.

Method 400 continues with operation 418 where a second insulating layer is deposited. The second insulating layer covers the second gate pattern and the second sidewall spacers, according to an embodiment. A thickness of the second insulating layer may be at least equal to or greater than a height of the second sidewall spacers. The second insulating layer may be any number of electrically insulating materials such as silicon dioxide, silicon nitride, high-k dielectric, or low-k dielectric materials. In one embodiment, the second insulating layer is a different material than the second sidewall spacers. The second insulating layer may also be the same material as the first insulating layer.

Method 400 continues with operation 420 where a contact hole is etched through the first and second insulating layers. The contact hole etch may be performed to expose the active regions in the substrate. In an embodiment, the contact hole etch has an etch rate through the first and second insulating layers that is substantially faster than an etch rate through the second sidewall spacers. In an embodiment, the contact hole etch exposes at least a portion of the second sidewall spacers.

Method 400 continues with operation 422 where the contact hole is filled with a conductive contact material. The contact material makes conductive contact with the active regions in the substrate. The contact material may be any well-known conductive material used to make contact with active regions of a substrate. Examples of contact materials include tungsten and metal alloys. Due to the presence of the second sidewall spacers, the contact material is spaced further apart from the first gate pattern as compared to conventional designs. This may help to reduce the risk of electrical shorting or detrimental parasitic effects between the first gate pattern and the contact material.

Figure 5:
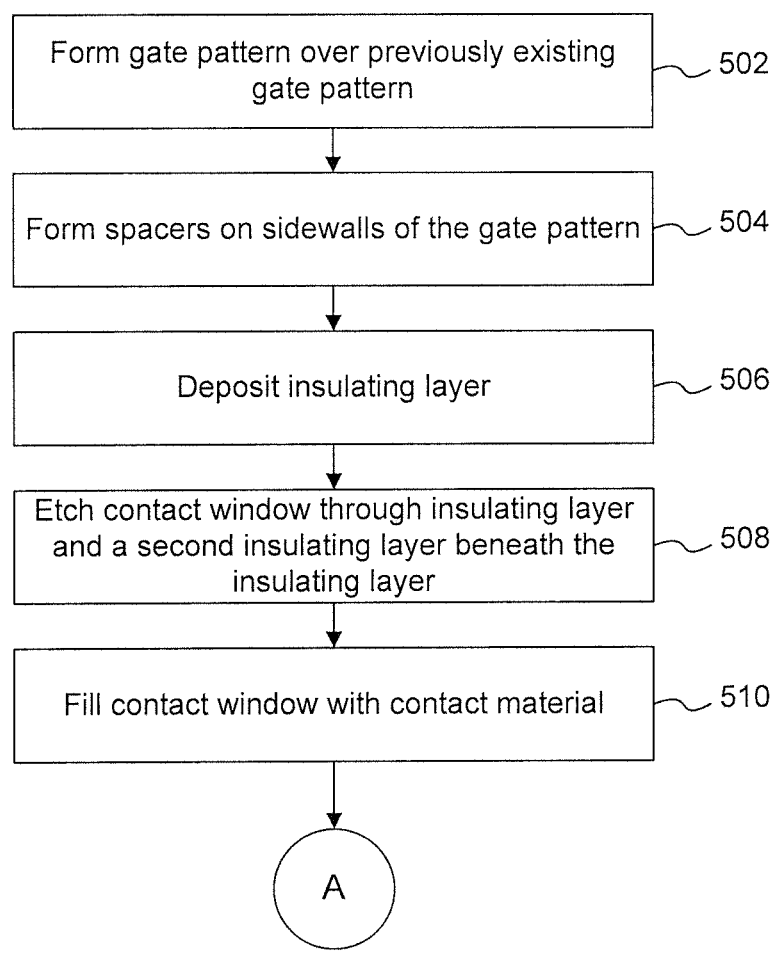
FIG. 5 is a flow diagram of an example method, according to an embodiment.

FIG. 5 is a flow diagram of an illustrative method 500, in accordance with an embodiment, of forming a semiconductor device, such as semiconductor device 200 or 300. It is understood that additional operations may be provided before, during, and after method 500, and some of the operations described below can be replaced or eliminated for additional embodiments of the method.

Method 500 begins at operation 502 where a conductive layer is patterned to form a gate pattern. The gate pattern is formed over an existing gate pattern, according to an embodiment. The gate pattern may be in electrically conductive contact with the existing gate pattern. The existing gate pattern is located over a substrate.

Method 500 continues with operation 504 where sidewall spacers are formed on sidewalls of the gate pattern. The sidewall spacers may be formed using an etch-back process where a layer of material is blanket deposited and etched until the material only remains on the sidewalls of structures. The sidewall spacers may be any number of electrically insulating materials such as, but not limited to, silicon dioxide, and silicon nitride. In an embodiment, the sidewall spacers are located above previously formed sidewall spacers that are on the sidewalls of the existing gate pattern.

Method 500 continues with operation 506 where an insulating layer is deposited. The insulating layer covers the gate pattern and the sidewall spacers, according to an embodiment. A thickness of the insulating layer may be at least equal to or greater than a height of the sidewall spacers. The insulating layer may be any number of electrically insulating materials such as silicon dioxide, silicon nitride, or high-k dielectric materials. In one embodiment, the insulating layer is a different material than the sidewall spacers.

Method 500 continues with operation 508 where a contact hole is etched through the insulating layer and through a second insulating layer located beneath the insulating layer. The contact hole etch may be performed to expose S/D. In an embodiment, the contact hole etch has an etch rate through the insulating layer that is substantially faster than an etch rate through the sidewall spacers. In an embodiment, the contact hole etch exposes at least a portion of the sidewall spacers.

Method 500 continues with operation 510 where the contact hole is filled with one or more electrically conductive materials. The contact makes electrical contact with the S/D regions in the substrate, according to an embodiment. The contact material may be any well-known conductive material used to make contact with S/D regions of a substrate. Examples of contact materials include tungsten and metal alloys. Due to the presence of the sidewall spacers, the contact material is spaced further apart from the existing gate pattern as compared to conventional designs. This may help to reduce the risk of electrical shorting or detrimental parasitic effects between the existing gate pattern and the contact material.

In one embodiment, a semiconductor device includes a first conductive gate pattern of a transistor, a first sidewall spacer along a sidewall of the gate pattern, a first insulating layer in contact with the sidewall spacer and having a planarized top surface, and a second sidewall spacer formed on the planarized top surface of the first insulating layer. The second sidewall spacer may be formed over the first sidewall spacer. A width of the second sidewall spacer is equal to or greater than a width of the first sidewall spacer.

The semiconductor device may further include a second conductive gate pattern formed over the first gate pattern. The second sidewall spacer is disposed along a sidewall of the second gate pattern.

The semiconductor device may further include a second insulating layer disposed over the first insulating layer. A thickness of the second insulating layer may be equal to or greater than a height of the second sidewall spacer. A contact may extend through the first and second insulating layers to make electrical contact with a doped S/D region. The doped S/D region may be located adjacent to the first sidewall spacer. In one example, the contact makes physical contact with at least a portion of the second sidewall spacer.

In another embodiment, a method of fabricating a semiconductor device includes forming a second conductive gate pattern over a first, previously formed, conductive gate pattern, and forming an sidewall spacer on a sidewall of the second conductive gate pattern. The second sidewall spacer is formed over a first, previously formed, sidewall spacer that is on a sidewall of the first conductive gate pattern. A width of the sidewall spacer is equal to or greater than a width of the previously patterned sidewall spacer.

It is to be appreciated that the Detailed Description section, and not the Abstract of the Disclosure section, is intended to be used to interpret the claims. The Abstract section may set forth one or more but not all exemplary embodiments of the present invention as contemplated by the inventor(s), and thus, is not intended to limit the present invention and the appended claims in any way.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of fabricating a semiconductor device on a substrate, comprising:
    forming a conductive gate pattern over a previously formed conductive gate pattern;
    after forming the conductive gate pattern, forming a first sidewall spacer on a sidewall of the conductive gate pattern, the first sidewall spacer being over a second sidewall spacer that is on a sidewall of the previously formed conductive gate pattern, wherein a full width of the first sidewall spacer is equal to or greater than a full width of the second sidewall spacer.

2. The method of claim 1, further comprising etching the conductive gate pattern to a final thickness that is less than a height of the first sidewall spacer.

3. The method of claim 1, further comprising depositing an insulating layer over the conductive gate pattern and the first sidewall spacer, wherein a thickness of the insulating layer is greater than a height of the first sidewall spacer.

4. The method of claim 3, further comprising etching a contact hole through the insulating layer and through a previously deposited insulating layer beneath the insulating layer to expose a source/drain (S/D) region on the substrate.

5. The method of claim 4, wherein the etching exposes at least a portion of the first sidewall spacer.

6. A method of fabricating a semiconductor device on a substrate, comprising:
    patterning a first conductive gate layer to form a first gate pattern;
    forming a first sidewall spacer on a sidewall of the first gate pattern;
    depositing a first insulating layer over the first gate pattern and the first sidewall spacer;
    polishing a top surface of the first insulating layer;
    forming a second gate pattern over, and in contact with, the first gate pattern;
    forming a second sidewall spacer on a sidewall of the second gate pattern, wherein a full width of the second sidewall spacer is equal to or greater than a full width of the first sidewall spacer.

7. The method of claim 6, further comprising etching the second gate pattern to a final thickness that is less than a height of the second sidewall spacer.

8. The method of claim 6, further comprising depositing a second insulating layer over the second gate pattern and the second sidewall spacer, wherein a thickness of the second insulating layer is greater than or equal to a height of the second sidewall spacer.

9. The method of claim 8, further comprising etching a contact hole through the first insulating layer and the second insulating layer to expose a source/drain (S/D) region on the substrate.

10. A method of fabricating a finFET device, comprising:
patterning a first conductive gate layer to form a first gate pattern over a fin that extends above a surface of a substrate;
fainting a first sidewall spacer on a sidewall of the first gate pattern;
depositing a first insulating layer over the first gate pattern and the first sidewall spacer;
polishing a top surface of the first insulating layer;
forming a second gate pattern over, and in contact with, the first gate pattern;
forming a second sidewall spacer on a sidewall of the second gate pattern, wherein a full width of the second sidewall spacer is equal to or greater than a full width of the first sidewall spacer.

11. The method of claim 10, further comprising etching the second gate pattern to a final thickness that is less than a height of the second sidewall spacer.

12. The method of claim 10, further comprising depositing a second insulating layer over the second gate pattern and the second sidewall spacer, wherein a thickness of the second insulating layer is greater than or equal to a height of the second sidewall spacer.

13. The method of claim 12, further comprising etching a contact hole through the first insulating layer and the second insulating layer to expose a source/drain (S/D) region on the substrate.

14. The method of claim 13, wherein the etching exposes at least a portion of the second sidewall spacer.

15. The method of claim 9, wherein the etching exposes at least a portion of the second sidewall spacer.

16. The method of claim 1, wherein the full width of the first sidewall spacer is between 50% and 75% wider than the full width of the second sidewall spacer.

17. The method of claim 6, wherein the full width of the second sidewall spacer is between 50% and 75% wider than the full width of the first sidewall spacer.

18. The method of claim 10, wherein the full width of the second sidewall spacer is between 50% and 75% wider than the full width of the first sidewall spacer.

19. The method of claim 6, further comprising forming a source/drain (S/D) region of the semiconductor device before depositing the first insulating layer.

20. The method of claim 10, further comprising forming a source/drain (S/D) region of the finFET device before depositing the first insulating layer.

* * * * *